United States Patent
Wang et al.

(10) Patent No.: US 9,887,342 B2
(45) Date of Patent: Feb. 6, 2018

(54) LASER PROCESSING OF SUPERCONDUCTOR LAYERS

(71) Applicant: Varian Semiconductor Equipment Associates, Inc., Gloucester, MA (US)

(72) Inventors: Connie P. Wang, Mountain View, CA (US); Paul Murphy, Reading, MA (US); Paul Sullivan, Wenham, MA (US); Sukti Chatterjee, Cupertino, CA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 15/415,071

(22) Filed: Jan. 25, 2017

(65) Prior Publication Data

US 2017/0133575 A1  May 11, 2017

Related U.S. Application Data

(63) Continuation of application No. 14/092,296, filed on Nov. 27, 2013, now Pat. No. 9,590,161.

(51) Int. Cl.
*H01L 39/12* (2006.01)
*H01L 39/24* (2006.01)

(52) U.S. Cl.
CPC .......... *H01L 39/128* (2013.01); *H01L 39/249* (2013.01); *H01L 39/2464* (2013.01); *Y10T 428/24174* (2015.01)

(58) Field of Classification Search
CPC .. H01L 39/2464; H01L 39/249; H01L 39/128
See application file for complete search history.

(56) References Cited

U.S. PATENT DOCUMENTS

| | | | |
|---|---|---|---|
| 5,096,882 A | 3/1992 | Kato et al. | |
| 5,326,746 A | 7/1994 | Ohtani et al. | |
| 5,714,767 A | 2/1998 | Nakamura et al. | |
| 5,906,965 A | 5/1999 | Rao | |
| 2008/0048278 A1 | 2/2008 | Hishinuma et al. | |
| 2009/0036313 A1* | 2/2009 | Stan | H01L 39/2461 505/238 |

* cited by examiner

*Primary Examiner* — Paul Wartalowicz

(57) ABSTRACT

A method of forming a superconductor includes exposing a layer disposed on a substrate to an oxygen ambient, and selectively annealing a portion of the layer to form a superconducting region within the layer.

18 Claims, 6 Drawing Sheets

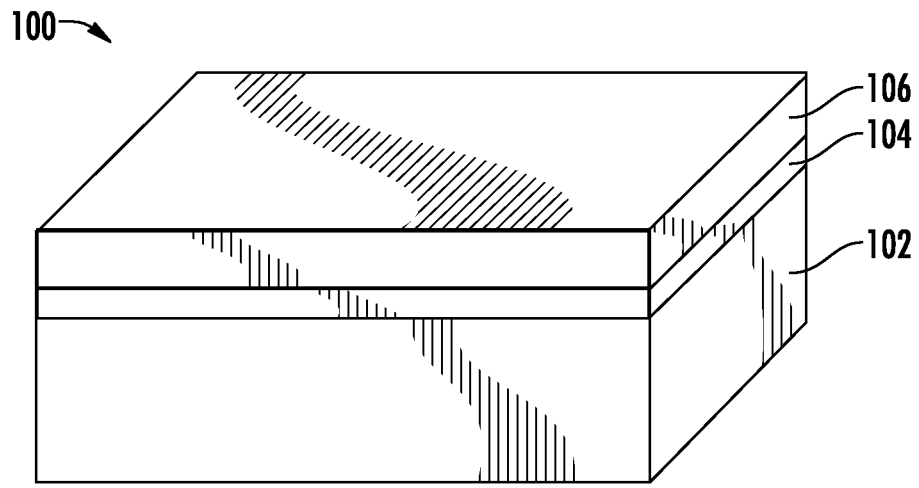
FIG. 1A
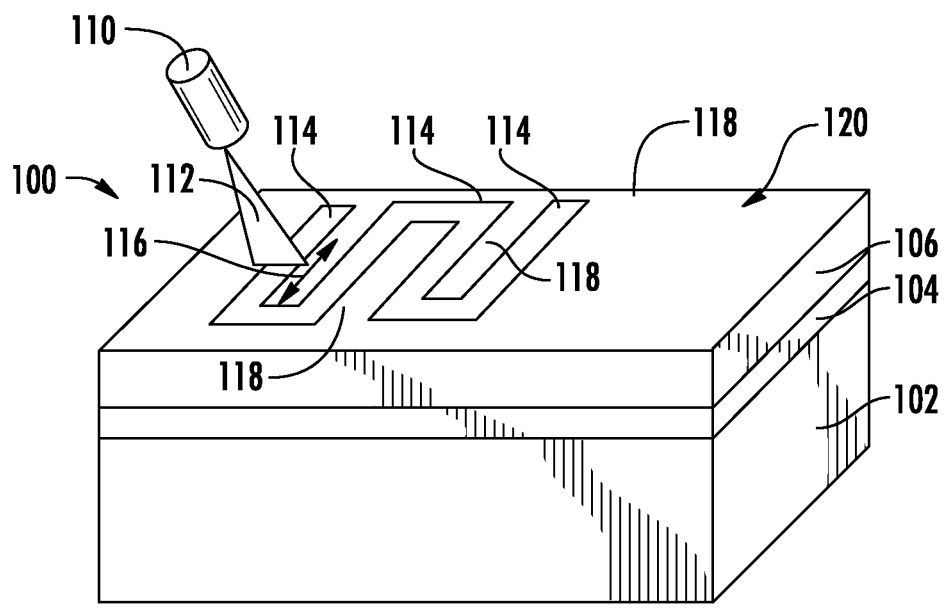
FIG. 1B
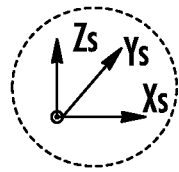

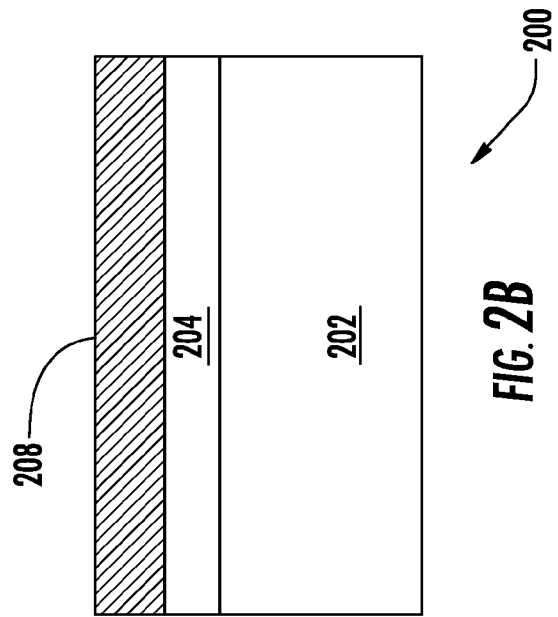
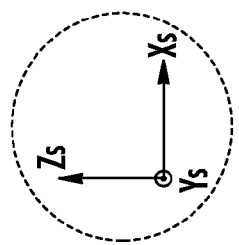
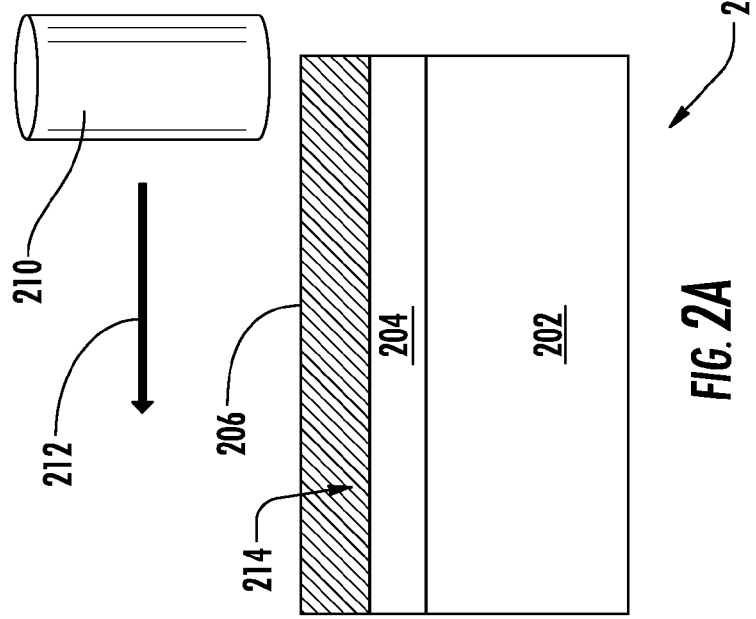
FIG. 2A
FIG. 2B

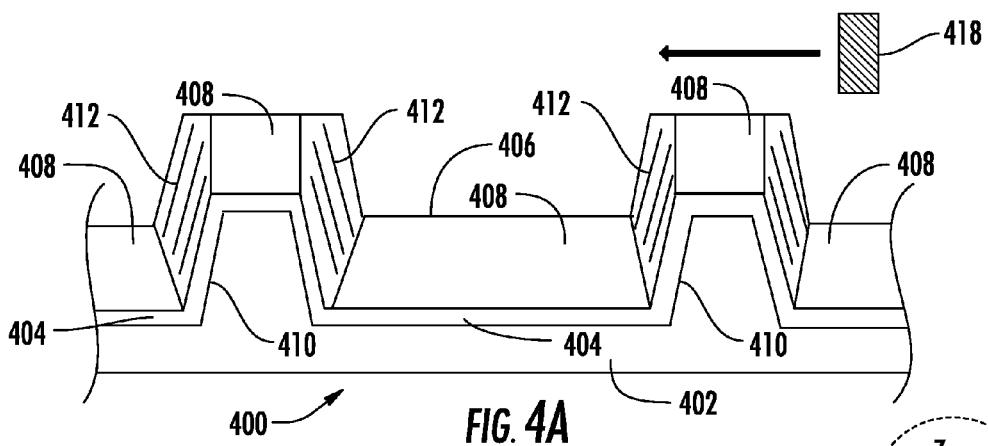
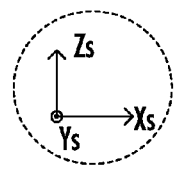
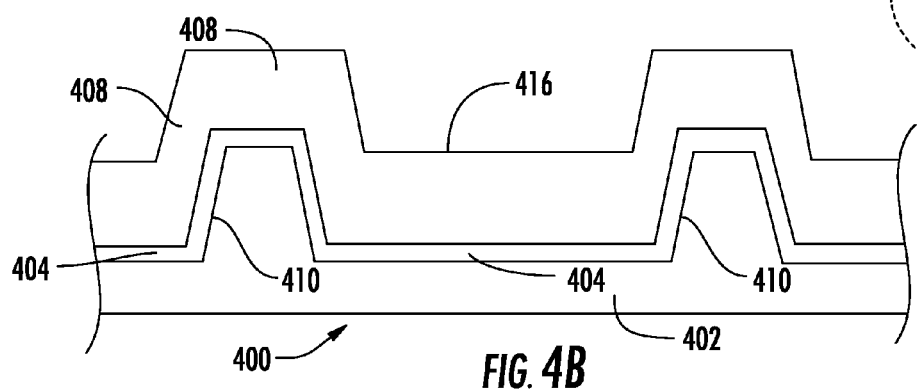
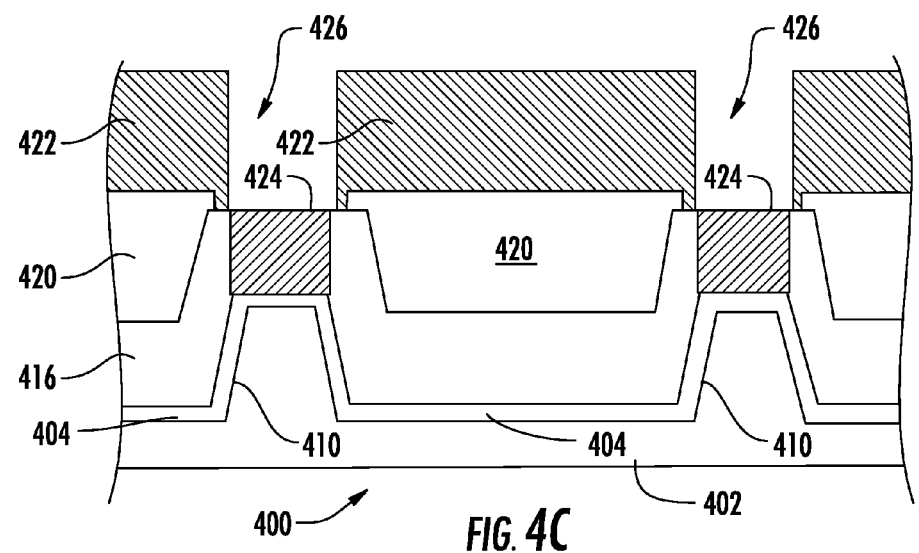

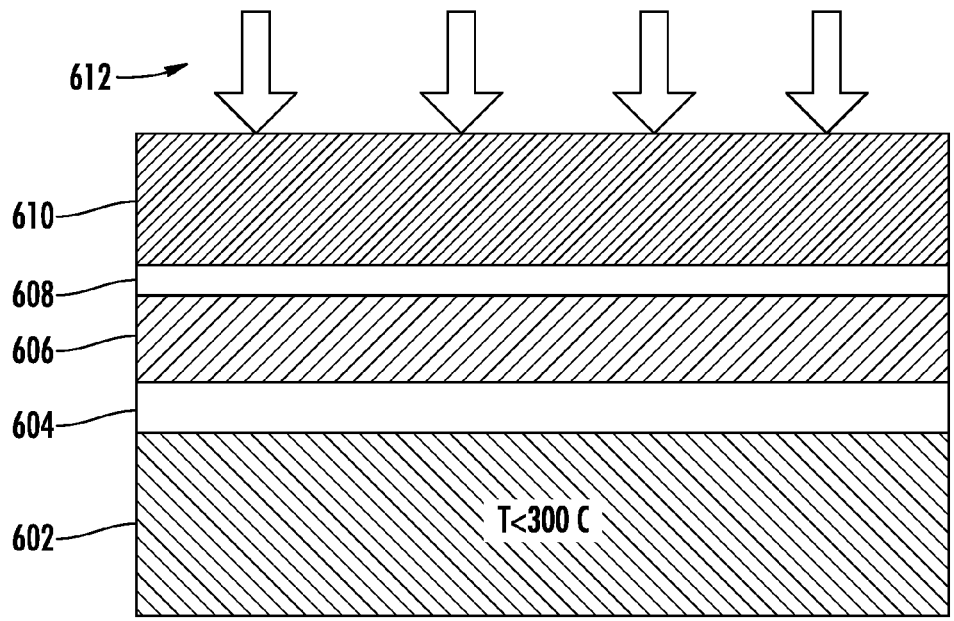
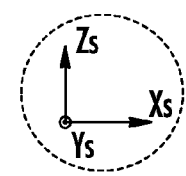
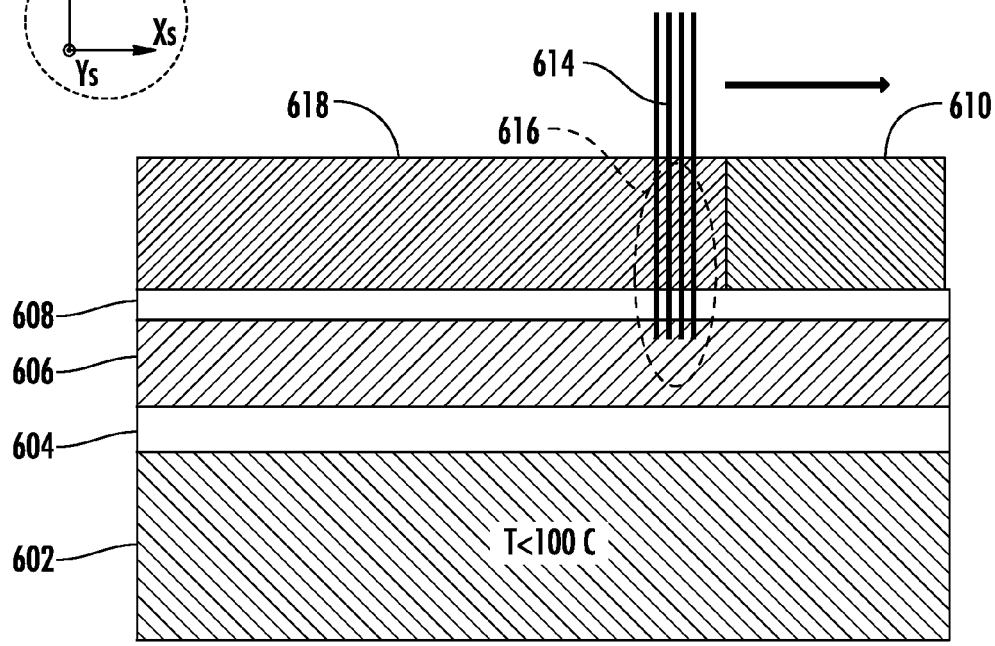

LASER PROCESSING OF
SUPERCONDUCTOR LAYERS

CROSS-REFERENCE TO RELATED
APPLICATION

This application is a continuation of U.S. patent application Ser. No. 14/092,296, filed Nov. 27, 2013, entitled "Laser Processing of Superconductor Layers" and incorporated by reference herein it its entirety.

FIELD

The present embodiments relate to superconducting materials and, more particularly, to patterned high temperature superconductor devices.

BACKGROUND

Superconducting devices have been developed based upon high temperature superconducting (HTc) materials which may have critical temperatures Tc above 77 K, facilitating their use in cryogenic systems cooled by liquid nitrogen. In certain various applications, such as use in superconducting fault current limiters (SCFCL), high temperature superconducting materials are fabricated upon substrates that present multiple processing challenges. Because HTc materials are complex layered oxides, their growth on substrates such as silicon or metal tapes presents materials and fabrication incompatibilities due to differing thermal properties between superconductor material and substrate, as well as incompatibility of silicon and commonly used tape metal elements with high temperature superconductivity. In addition, relatively thick layers of HTc material (>2 um) are often desirable to provide a target current capability (e.g., >300 A in 1 cm width tape), which may lead to stress and cracking in the HTc layer due to thermal expansion coefficient (TEC) mismatch between HTc material and substrate when grown at high temperature. For example, when an HTc layer is deposited on a Si substrate, stress induced cracking can already be observed in ReBCO material of thickness greater than 0.5 um. Moreover, a high degree of c-axis preferred orientation of an HTc layer is often needed to meet device requirements, which may be difficult to achieve in thick layers grown on heterogeneous substrates such as silicon or steel. The patterning of HTc layers to form desired device structures such as current-carrying lines presents another set of challenges due to the need to etch a complex layer stack of materials used to form the HTc device. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of forming a superconductor includes exposing a layer disposed on a substrate to an oxygen ambient; and selectively annealing a portion of the layer to form a superconducting region within the layer.

In a further embodiment, an integrated superconductor device includes a substrate base; a buffer layer disposed on the substrate base and comprising a preferred crystallographic orientation; and a superconductor layer disposed on the buffer layer, the superconductor layer comprising a superconducting region, and a non-superconducting region outside the superconducting region, wherein the non-superconducting region and superconducting region have at least three elements in common.

BRIEF DESCRIPTION OF THE DRAWINGS

FIGS. 1A and 1B present an isometric view of a substrate that depict different stages of processing of a superconductor layer according to an embodiment of the disclosure;

FIGS. 2A and 2B depict an embodiment in which a laser is used to write a c-axis oriented superconductor region in a substrate;

FIGS. 4A-4C depict different instances in laser processing for forming an integrated superconductor tape structure consistent with embodiments of the disclosure;

FIGS. 6A and 6B depict exemplary operations for forming a low stress thick superconductor layer on a substrate consistent with the present embodiments.

DETAILED DESCRIPTION

Figure 3A:
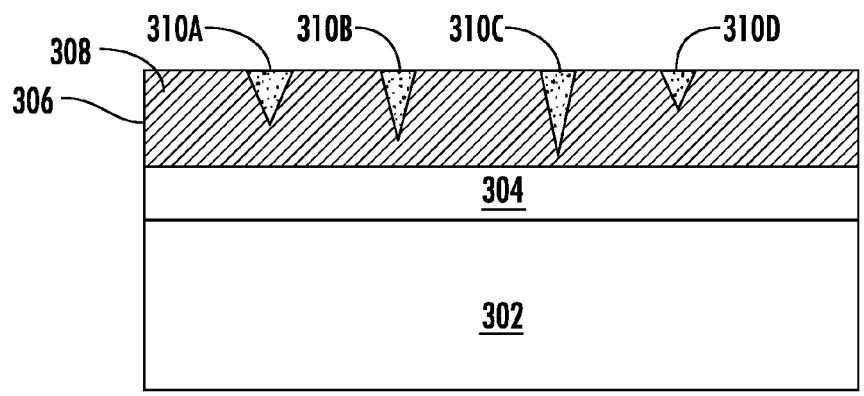
FIGS. 3A to 3C depict an embodiment in which a superconductor layer is processed to reduce the amount of misoriented crystallites within the superconductor layer.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor structures, embodiments are described herein that provide improved techniques for processing superconductor layers that are integrated into a substrate such as superconductor tapes. Various embodiments entail the use of a laser beam to selectively process portions of a superconductor layer. The selective processing may involve laser annealing to perform direct writing of a high critical current superconductor pattern in a substrate to target areas of the substrate. The superconductor pattern may be used to form a superconductor tape in some embodiments. The selective processing may further entail directing a laser beam to targeted areas of a superconductor layer to recrystallize lower critical current regions into a superconductor microstructure that provides higher critical current. In particular embodiments, the selective processing may entail depositing laser energy in a surface region of a substrate to crystallize a thick superconductor layer to form a high critical current structure without undue stress.

In particular embodiments, a laser beam may perform a laser anneal a target region of a superconductor layer that has an initial critical current that is relatively lower or zero critical current at a reference or use temperature such as 77 K. As used herein, the term "low Jc" or "low critical current" refers to a critical current less 1 $MA/cm^2A$, and "high Jc" or "high critical current" refers to critical current above 2.5 $MA/cm^2$.

FIGS. 1A and 1B present an isometric view of a substrate 100 that depict different stages of processing of a layer using a laser beam according to an embodiment of the disclosure. In FIG. 1A, there is shown a layer stack that includes a buffer layer 104 and layer 106 disposed on a substrate base 102. In various embodiments, the layer 106 may be an amorphous or polycrystalline material that is composed of material capable of forming a highly oriented superconductor. In particular embodiments, a substrate base 102 may be silicon while the buffer layer 104 is an oriented $CeO_2$ or yttrium stabilized zirconia layer. In other embodiments, a substrate base 102 may be Hastelloy or stainless steel while the buffer layer 104 is an oriented oxide layer formed by in beam assisted deposition. The embodiments are not limited in this context.

In some embodiments, the substrate base 102 may be a large area substrate such as a large area silicon substrate or glass substrate. The buffer layer 104 may itself include a single layer or more than one layer (not explicitly shown) which may serve to chemically isolate the substrate base 102 from the layer 106, as well as to provide a crystalline template from which to grow a crystallographically oriented superconductor layer. In particular, the buffer layer 104 may be configured to prevent inter-reaction of the layer 106 and substrate base 102 as well as to provide a crystalline template for growth of a crystallographically oriented copper oxide-based superconductor layer, examples of which are listed immediately below. In some embodiments, the layer 106 may be made of a superconductor material having the formula $ReBa_2Cu_3O_{7-x}$ (also referred to herein as "ReBCO") where Re stands for yttrium or any rare earth element. In other embodiments, the layer 106 may be a bismuth strontium calcium copper oxide (BSCCO) of the general formula $Bi_2Sr_2Ca_{n-1}CU_nO_{2n+4+x}$; a thallium strontium calcium copper oxide (TSCCO) of the general formula $Tl_2Sr_2Ca_{n-1}Cu_nO_{2n+4+x}$; mercury strontium calcium copper oxide (MSCCO) of the general formula $HgSr_2Ca_{n-1}Cu_nO_{2n+2+x}$. The embodiments are not limited in this context.

As detailed in the embodiments to follow, the layer 106 or portions of the layer 106 less than the whole layer may be formed in a manner in which at least after initially being deposited on the buffer layer 104, the layer 106 has poor superconducting qualities or other defects. In some cases, the layer 106 may be poorly crystalline or amorphous. As may be appreciated by those of ordinary skill in the art, a poorly crystalline or non-crystalline layer having the general composition of a superconductor material may exhibit little or no superconductivity at a use temperature, such as 77 K. For example, the critical temperature (Tc) at which the material becomes superconducting may decrease in a poorly crystalline material. The critical current (Jc) that defines the limit of current that a superconductor may transmit while maintaining superconducting state, may also decrease to a low Jc value in a poorly crystalline superconductor layer with respect to Jc produced by a highly crystalline superconductor layer. In some cases, a crystalline superconductor layer in which the crystallites have certain orientation may also yield relatively lower Jc even though Tc may exhibit an acceptable value.

In HTc superconductor materials systems such as BSSCO and TSSCO, among others, the crystalline structure of the HTc material is tetragonal, in which two mutually orthogonal axes of the unit cell are equal (the "a" axis) and a third axis (c-axis) that is mutually orthogonal to the a-axes is elongated and exhibits a much larger dimension than the a-axis. In the ReBCO case, the crystalline structure is orthorhombic when superconducting, where the a-axis is about 2% different in size as compared to a b-axis, and the c-axis is about three times longer than the a-axis or b-axis. In all these HTc superconductor systems, the crystal structure is characterized by copper oxide planes that conduct electrical current in a direction perpendicular to the c-axis. Thus, when an HTc material layer is disposed on a substrate that contains crystallites having their c-axes oriented perpendicularly to the substrate plane (see plane Xs-Ys in FIG. 1A), the copper oxide planes are aligned parallel to the substrate plane, providing a favorable orientation to conduct electrical current in directions parallel to the substrate plane.

In many applications, the current is carried in the plane of the substrate, such that to improve the current carrying properties in the superconductor tape it may be desirable to impart a "c-axis" texture to the superconductor layer. This refers to a preferred crystallographic orientation in which the c-axis of crystallites are arranged perpendicularly to the plane of the tape in preference over other possible orientations. In a pure c-axis texture all crystallites exhibit a c-axis orientation, which may promote a higher Jc than other orientations.

On the other hand, HTc materials may form in layers on a substrate that have a random polycrystalline microstructure in which the orientation of the c-axis of a crystallite varies between crystallites, or may form what is termed herein an "a-axis" orientation in which the a-axis (and/or b-axis in the case of ReBCO) is oriented perpendicularly to the plane of the substrate. In the case of an a-axis orientation, the c-axis of crystallites is oriented parallel to the plane of the substrate. In each of these cases, the critical current of the superconductor layer is lower than in case of a c-axis textured HTc layer.

In various embodiments disclosed herein, laser processing of a superconductor layer is used to increase Jc at a given temperature in target portions of the superconductor layer. For cases in which a superconductor device is to operate at 77 K, for a superconductor layer having a random orientation of crystallites, an a-axis orientation of crystallites, a poorly crystalline microstructure, an oxygen deficiency, or amorphous structure, the Jc may be unacceptably low or zero (in the amorphous case). Accordingly, a laser beam may be directed to targeted portions of the superconductor layer where high critical current is desired in order to generate the appropriate microstructure in the targeted portions for high Jc, which may be a c-axis orientation for many superconductor systems as described below. For example, in applications in which ReBCO or BSCCO materials are used as superconductor tapes, a tape structure may be formed within a flat substrate by forming a stack of layers including a superconductor layer and metal layers within a substrate and then patterning those layers to form a tape-like shape in the plane of the substrate. Such a shape may be serpentine, spiral, or other shape in some examples.

Turning now to FIG. 1B, there is shown an instance of processing the substrate 100 using a laser source 110 that directs a laser beam 112 (shown in highly schematic depiction) toward the surface of the layer 106. In various embodiments, the laser source 110 may be a $CO_2$-laser, an Excimer XeCl laser, $N_2$ laser, Cu vapor laser, or Nd:YAG pulse laser. The embodiments, however, are not limited in this context. In one example, it may be assumed that the layer 106 has poor crystalline quality and exhibits poor superconducting properties including a low Jc. As illustrated in FIG. 1B, when the laser source 110 directs a laser beam 112 to the substrate 100, the laser source 110 or the substrate 100 may be moved or scanned with respect to one another in order to expose target regions of the layer 106. This motion may take place by moving the substrate 100, while the laser source 110 is stationary, moving the laser source 110 with a stationary substrate 100, or moving both at the same time. For the purposes of the present embodiments, any of the above motions are equivalent to any other to describe relative motion or scanning of the laser source 110 with respect to substrate 100. The laser source 110 may also be stepped from one position to another along the surface 120 of the substrate 100 in a manner that exposes some portions of the surface 120 to the laser beam 112 while leaving other portions unexposed. As shown in FIG. 1B, the laser beam 112 may be scanned along direction 116 parallel to the Ys axis and scanned along the Xs-direction to write a laser annealed strip 114, while regions 118 adjacent the laser annealed strip 114 remain unexposed to the laser beam 112.

In one particular example, the regions 118 and any other regions of the layer 106 that are unexposed to the laser beam 112 may be poorly crystalline or amorphous material having the general composition of a superconducting phase such as ReBCO. Accordingly, the regions 118 may be suitable for forming high quality superconductor material given proper treatment, but may exhibit low Jc or zero Jc at a use temperature such as 77 K.

In the embodiment of FIG. 1B, the laser annealed strip 114, on the other hand, represents material of the layer 106 that is altered in a manner to become superconducting. The superconductor strip 114 has a serpentine pattern in FIG. 1B, but strips, lines, or other features may be arranged in other patterns in other embodiments. In some embodiments, the regions 118 may be amorphous or poorly crystalline material that exhibits zero Jc at 77 K, while the laser annealed strip 114 may have a highly crystalline microstructure in which different grains have randomly oriented crystallographic orientations. In such an embodiment, the laser annealed strip 114 may exhibit a Tc characteristic of the material, such as ~90-95 K for an ReBCO material, but may exhibit a moderate Jc due to the mixed orientation of crystallites. Thus, the laser annealed strip 114 may represent superconductor strips that are embedded within a non-superconductor matrix. The laser annealed strips 114 and region 118, which both contain ReBCO material, thus share at least three elements in common, although the oxygen content and the crystallinity may be higher in the laser annealed strips 114. Such structures may be appropriate for applications where maximizing current carrying capability in the superconductor strips is not paramount.

In other embodiments, the regions 118 may be amorphous, poorly crystalline material, while the laser annealed strip 114 may have a highly crystalline microstructure in which the crystallites exhibit a high degree of preferred crystallographic orientation (texture). In some cases, the laser annealed strip 114 may exhibit a high degree of c-axis texture. This orientation, in particular, generates a high critical current within the Xs-Ys plane shown. Thus, in one embodiment in which the layer 106 is initially amorphous, the laser beam 112 may be employed to write high Jc laser annealed strip 114 within a non-superconducting, zero Jc layer. Such a pattern may be appropriate for forming integrated superconductor tapes in which high Jc is a desirable feature.

In various embodiments, the state of substrate 100 may represent two stages in formation of an integrated superconductor device. For example, the layer 106 may be a YBCO material deposited by a high rate process, at relatively low substrate temperature such as below about 7000° C., or at relatively low oxygen pressure (<0.01 Torr, typical at $10^{-3}$ to $10^{-5}$ Torr oxygen partial pressure), or any combination of the three. This may yield a poorly crystalline or non-crystalline YBCO. During the exposure to laser 112 a high partial pressure of oxygen may be provided to the ambient of substrate 100, such as greater than 0.1 Torr of oxygen an in particular embodiments at an oxygen pressure of 1-100 Torr). This may result in formation of a highly crystalline, highly oriented YBCO layer having the proper oxygen stochiometry suitable to generate high Jc.

In various embodiments, a buffer layer may be selected to provide a template for desired microstructure of a superconductor layer subsequently formed on the buffer layer. The properties of the buffer layer may be exploited by laser processing in order to selectively write target regions within a superconductor layer with a given crystallographic orientation. FIGS. 2A and 2B depict an embodiment in which a laser is used to write a c-axis oriented superconductor region in a substrate. As shown in FIG. 2A a substrate 200 is subject to processing by a laser source 210, which is moved with respect to the substrate 200 along a direction 212 parallel to the X-axis. During this movement the laser source 210 is configured to generate a laser beam (not shown) that impacts the substrate 200. As shown, the substrate 200 includes a substrate base 202, buffer layer 204, and layer 206.

The buffer layer 204 provides a template for epitaxial growth of highly oriented superconductor crystallites on its surface 214. The buffer layer 204 may vary according to the nature of the substrate base 202. For example, if the substrate base 202 is a glass material, the buffer layer may be a stack of sublayers such as the following, in order from substrate base 202: silicon nitride or yttrium oxide; magnesium oxide; and optional lanthanum manganate layer. The embodiments are not limited in this context. The top sublayer of the buffer layer 204 may provide a crystalline surface having the proper crystal structure, lattice parameter, and crystallographic orientation for epitaxial growth of a superconductor layer thereon having a c-axis texture.

In another embodiment, the substrate base 202 is made of single crystalline silicon. In this example, the buffer layer 204 may, but need not be, be a single layer that grows epitaxially on the silicon substrate. Examples of this include $CeO_2$ and $CaF_2$, each of which have the face centered cubic fluorite crystal structure, which space group is directly related to that of silicon. For this reason, highly oriented or single crystalline $CaF_2$ or $CeO_2$ may be grown on silicon. In particular, the lattice parameter of $CeO_2$ exhibits merely a 0.35% lattice mismatch with that of silicon, resulting in the ability to grow epitaxial layers of $CeO_2$ directly on silicon.

In order to exploit the crystalline properties of the buffer layer 204 to selectively write regions of superconductor material having a high degree of c-axis texture, the layer 206 may be deliberately deposited in a non-crystalline or poorly crystalline state. This may be accomplished by any combination of high rate deposition, low temperature deposition (<700° C.) and low oxygen ambient deposition, for example. When deposited under such conditions epitaxial growth of the superconductor layer to form a high degree of c-axis texture may be suppressed, resulting instead in either an amorphous microstructure, poorly crystalline microstructure or a more randomly oriented microstructure. However, once target regions of the superconductor layer are exposed to a laser beam from the laser source 210, the laser beam may selectively heat the target regions to temperatures sufficient to recrystallize the superconductor material being heated. Because the layer 206 is disposed on a surface that provides the proper template to promote epitaxial formation of c-axis texture superconductor material, when the target portions of the layer 206 heat up, the heated material reorganizes into crystallites having c-axis orientation. In various embodiments, and without limitation, a laser source 210 may heat the target regions of a layer 206 to temperature above 400° C., and is some cases in the range of 750° C. to 1000° C. During the heating by the laser source 210, the oxygen partial pressure surrounding the layer 206 may be about 0.1 Torr to 100 Torr in some embodiments.

Because the heat generated by a laser beam may be spatially localized, regions of the layer 206 proximate to the laser beam may heat up, forming c-axis texture region 208. These regions, in turn form a high critical current (Jc) region within the layer 206. It is to be noted that the c-axis texture region 208 depicted in FIG. 2B may constitute a strip structure as illustrated for laser annealed strip 114 of FIG. 1B. Because a laser beam generates heat locally that spreads from a region in which the laser beam strikes the substrate 200, regions of the substrate that are remote from where a laser beam strikes the substrate 200 do not heat up sufficiently to recrystallize. Accordingly, the laser source 210 may be used to locally write c-axis texture into target portions the layer 206 to form regions of high Jc adjacent other regions that exhibit zero Jc or low Jc.

An advantage of the above techniques of FIGS. 1A, 1B, 2A and 2B is that a superconductor layer may be formed by a rapid growth process without the need to ensure accurate oxygen stochiometry to the growing film or proper crystalline microstructure. This allows a range of commercial deposition process to be harnessed for formation of the layer 106, 206. In addition, for applications in which only select regions on a substrate surface are to be rendered superconducting, such as for integrated superconductor tapes, the technique of FIGS. 2A and 2B does not require physical isolation of the superconducting structures. Thus, a serpentine superconducting strip or other pattern that may form a tape-like structure can be fabricated within a layer 106, 206 without having to perform lithography and etching to remove material outside the superconductor line. This is because material in the layer 106, 206 outside of a strip that is has the nominal composition of the superconductor phase may nevertheless be non-superconducting at a use temperature, having little or no effect on the operation of the superconductor tape for its intended use.

Figure 3B:
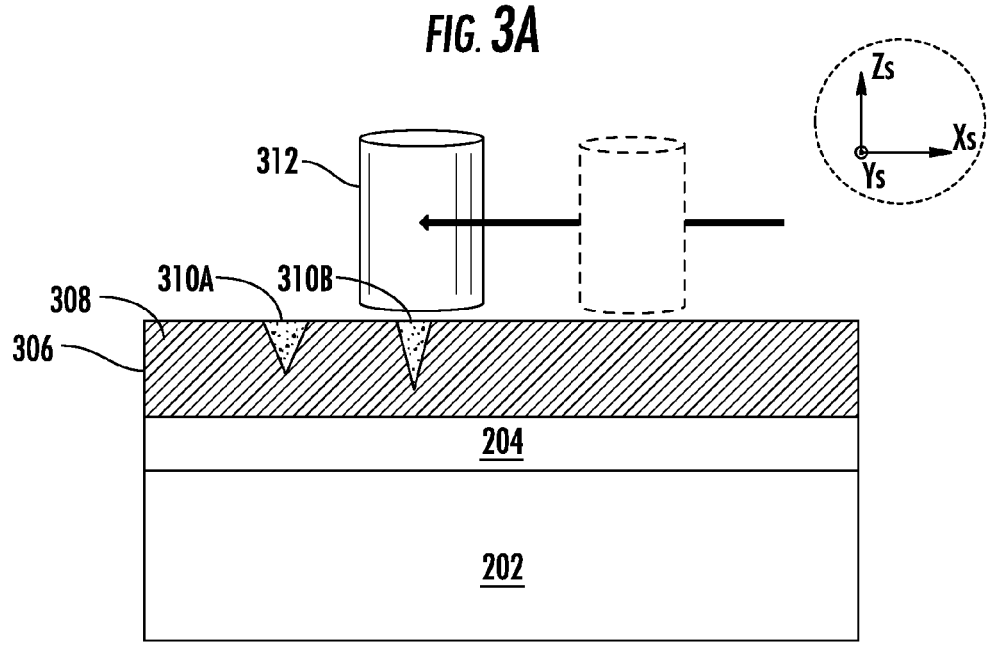
Figure 3C:
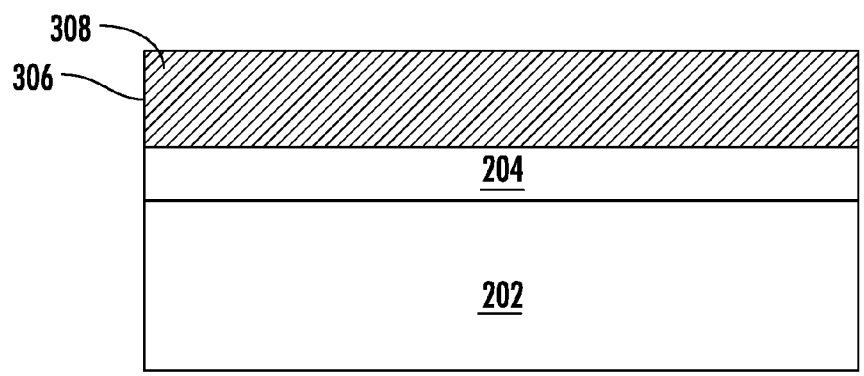

In addition to harnessing a laser beam to write high Jc superconductor regions having a c-axis texture within an amorphous or poorly crystalline layer, in other embodiments, a laser beam may be employed to locally recrystallize regions of a superconductor layer to improve the degree of c-axis texture. FIGS. 3A to 3C depict an embodiment in which a superconductor layer is processed to reduce the amount of mis-oriented crystallites within the superconductor layer. In FIG. 3A, there is shown a substrate 300 having a substrate base 302, buffer layer 304, and layer 306. In one example, the layer 306 is a highly crystalline ReBCO layer in which a majority of the layer 306 is composed of c-axis region(s) 308 that contain crystallites having c-axes oriented along the Zs-axis as shown. The c-axis region 308 may thus exhibit a high critical current within the Xs-Ys plane parallel to the plane of the substrate 300. The layer 306 also includes a-axis regions 310A-310D, which may be dispersed within the c-axis region 308. The a-axis regions 310A, 310B, 310C, and 310D have lower Jc within the Xs-Ys plane and may suppress the overall Jc within the layer 306.

In FIG. 3B, a laser source 312 directs a laser beam (not separately shown) to the layer 306 while scanning along the Xs axis. In so doing, the layer 306 may be locally heated sufficiently to cause grain growth of c-axis oriented crystallites. This causes consumption of the a-axis regions 310A-310D by the growing c-axis grains, resulting in a final microstructure shown in FIG. 3C in which the layer 306 uniformly is composed of the c-axis region 308.

In further embodiments, laser processing such as laser annealing may be used to locally induce c-axis orientation in superconductor layers formed on non-planar substrates. FIGS. 4A-4C depict different instances in laser processing for forming an integrated superconductor tape structure consistent with embodiments of the disclosure. In FIG. 4A, there is shown a patterned substrate 400 that includes a substrate base 402 that is non-planar. The substrate base 402 includes a set of structures 410 that have the shape of protrusions that extend outward along the Zs direction. In one embodiment, the substrate base 402 may be a silicon wafer that includes the structures 410 which are etched into the silicon wafer to form integral surface structures. A buffer layer 404 is disposed upon the substrate base 402, which conformally coats the substrate base 402 including the structures 410. The buffer layer 404 may serve as a template for growth of an oriented superconductor layer thereupon. As further shown in FIG. 4A, a superconductor layer 406 is disposed upon the buffer layer 404. The superconductor layer 406 has a non-planar, undulating geometry that provides a larger surface area per projected surface area in the Xs-Ys plane, thereby providing a means to increase critical current per unit area in a device.

As shown in FIG. 4A, the superconductor layer 406 includes regions 408 in which crystallites have c-axis orientation, that is, the c-axis is oriented along the Zs direction. The regions 408 form in portions of the substrate 400 where the buffer layer 404 lies parallel to the Xs-Ys plane. This imparts a high critical current for regions 408 when current is to be conducted within the plane of the substrate 400, that is, in a plane parallel to the Xs-Ys plane. The superconductor layer 406 also includes regions 412 that are disposed adjacent buffer layer 404 alongside sidewall portions of the structures 410. In this case, the regions 412 have superconductor crystallites that do not exhibit a c-axis orientation with respect to the Xs-Ys plane and may therefore exhibit a low critical current.

In FIG. 4B, there is shown the structure of the substrate after a laser beam 418 is directed over those regions depicted in FIG. 4A. The laser annealed superconductor layer 416 now contains entirely regions 408. When the laser beam 418 intersects the substrate 400, the laser beam 418 may anneal the superconductor layer 406 in a manner that causes c-axis oriented grains (crystallites) in regions 408 to grow at the expense of grains in the regions 412, resulting in a uniform microstructure of laser annealed superconductor layer 416, which may provide a higher critical current than in superconductor layer 406.

After formation of a high critical current layer, the substrate 400 may be processed further to form metal lines that define a superconductor tape structure. Such structure may be used to form a current limiter device in which the superconductor layer conducts current through the tape structure under normal current conditions. When a fault occurs, such as an electrical current surge, excess current flowing through the superconductor layer may cause the superconductor layer to transition into a non-superconducting state. The excess current may then be shunted through metal lines of the superconductor tape structure.

FIG. 4C depicts a further stage of processing in which the substrate 400 now includes an integrated superconductor tape structure. In this example, shunt metal lines 420 are formed between adjacent structures 410. The shunt metal lines 420 may function as current shunts in a superconductor tape that conduct current when the laser annealed superconductor layer 416 is not in a superconducting state, such as under a fault condition. Metal protection lines 422 are disposed on top of the shunt metal lines 420. Non-superconductor regions 424 are formed within the laser annealed superconductor layer 416. In various embodiments, after formation of the shunt metal lines 420 and metal protection lines 422, the non-superconductor regions 424 may be formed by altering the portion of the laser annealed superconductor layer 416 that lies below exposed regions 426 and is not covered by shunt metal lines 420 and metal protection lines 422. Alternatively, superconductor material may be entirely removed from exposed regions 426. The final device thus formed in substrate 400 may thus provide an integrated superconductor tape having enhanced critical current in comparison to planar superconductor tape structures.

Figure 5A:
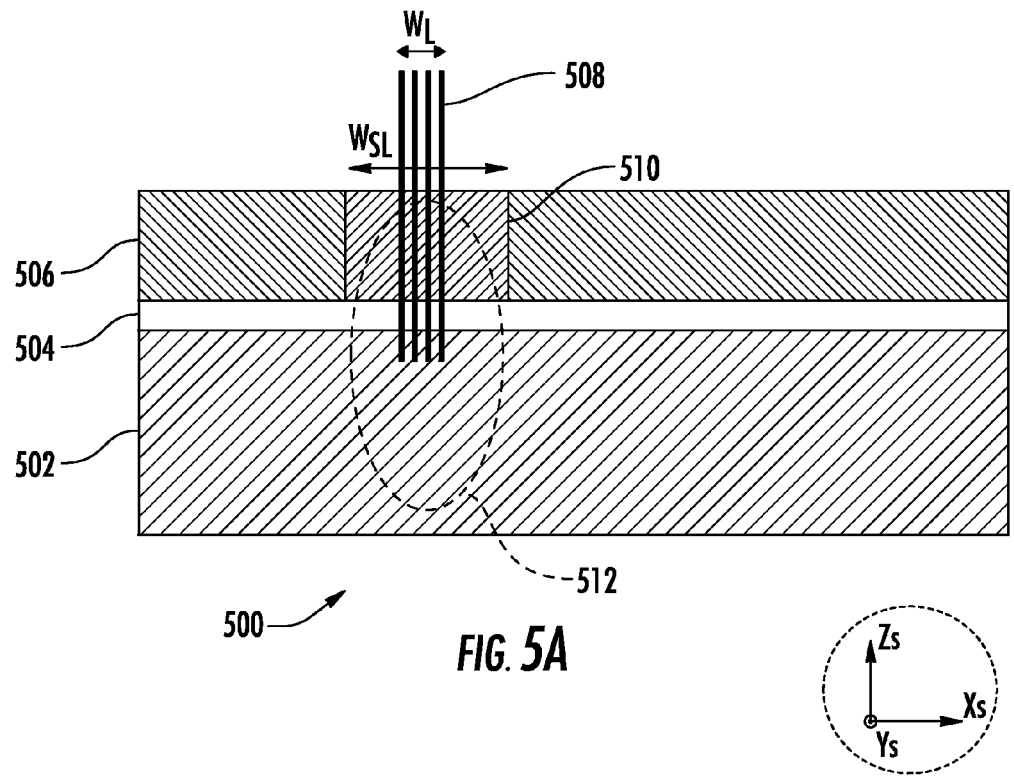
FIGS. 5A and 5B present a comparison of direct laser writing of a superconductor region in bulk silicon substrate and a silicon-on-insulator substrate.
Figure 5B:
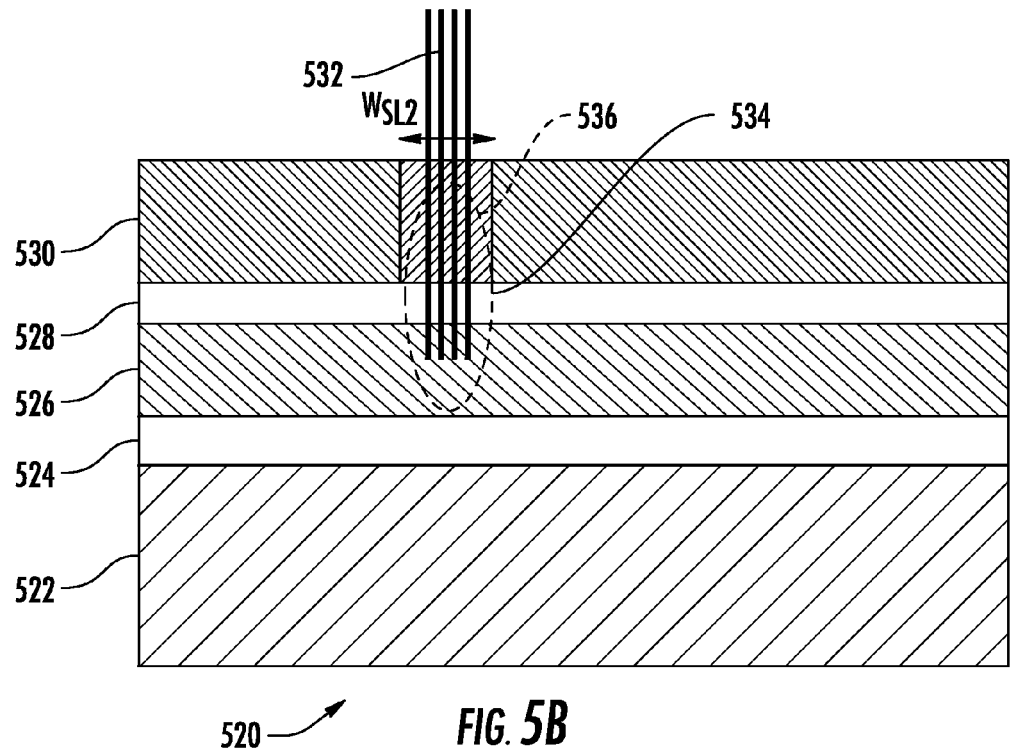

In order to increase localization of processing of a superconductor layer using a laser beam, in various other embodiments, the layer structure of the substrate being processed may be configured to limit the region in the substrate that is heated by the laser beam. FIGS. 5A and 5B present a comparison of direct laser writing of a superconductor region in bulk silicon substrate and a silicon-on-insulator substrate that illustrates the use of substrate layers to modify the laser writing. In FIG. 5A, the substrate 500 has a bulk silicon substrate base 502, which may be many tens or hundreds of micrometers in thickness. In the embodiment illustrated in FIG. 5A, a laser beam 508 having a width $W_L$ is directed to the substrate 500, which also includes a buffer layer 504 and unprocessed layer 506. The unprocessed layer 506 may be composed of poorly crystalline material of a given superconductor phase such as YBCO in one example. The YBCO material that forms the unprocessed layer 506 may further be deficient in oxygen such that at a target use temperature of the substrate 500, e.g., 77 K, the unprocessed layer 506 has zero Jc, that is, is not in the superconducting state.

It may be desirable to write superconductor lines or structures of high superconducting quality such as high Tc in the range of 90-95 K, and high critical current (Jc) at 77 K. Accordingly, in one particular example, the laser beam 508 may be directed along the Ys direction. As shown in FIG. 5A, the laser beam 508 is delivered to the substrate 500 to locally heat up a portion of the substrate 500 and thereby anneal a portion of the unprocessed layer 506. This may form, for example, a line as the laser beam 508 is scanned along the Ys direction. This is shown in cross section as the laser annealed superconductor line 510. To form the laser annealed superconductor line 510 the laser beam 508 is directed with sufficient fluence and duration to locally heat the substrate 500 to a temperature of, for example, 750° C. to 1000° C. In order to heat the substrate, the laser energy is deposited in regions such as the bulk silicon substrate base 502 that absorb energy from photons at wavelengths used in the laser beam 508. The buffer layer 504 and unprocessed layer 506 may be less efficient at absorbing the laser light while most energy is deposited in the bulk silicon substrate base 502. A heated zone 512 may initially form as illustrated and spread outwardly after the laser beam 508 is removed, resulting in transformation of the unprocessed layer 506 to form the laser annealed superconductor line 510 having a line width $W_{SL}$ as shown.

In the embodiments shown in FIG. 5B, the substrate 520 includes a bulk silicon substrate base 522 upon which a buried oxide layer 524 is formed, which may be one micrometer in thickness in one example. On top of the buried oxide layer 524 is disposed a silicon layer 526 which may be 1-5 micrometers in thickness in some embodiments. A buffer layer 528 is grown on the silicon layer 526, and an unprocessed layer 530 grown on the buffer layer 528. The buffer layer 528 may be the same as the buffer layer 504. When laser beam 532 impinges upon the substrate 520, a portion of the unprocessed layer 530 is heated and transformed into a laser annealed superconductor line 536 generally in the manner described above with respect to FIG. 5A. However, the buried oxide layer 524 may thermally isolate the bulk silicon substrate base 522 from the silicon layer 526, such that the silicon layer 526 is heated to a desired temperature range while the bulk silicon substrate base 522 remains at temperatures closer to room temperature. In this case, the heated zone 534 may be better defined than the heated zone 512, and may require less laser fluence of laser beam 532 to generate a desired temperature in unprocessed layer 530. This may yield a more well defined and narrower superconductor line, shown as the laser annealed superconductor line 536 having line width $W_{SL2}$.

Further advantages may accrue for laser processing of superconductor layers formed on SOI substrates. FIGS. 6A and 6B depict exemplary operations for forming a low-stress thick superconductor layer on a substrate consistent with additional embodiments. In FIG. 6A, a SOI substrate 600 includes a bulk silicon substrate base 602, buried oxide 604, silicon layer 606, and buffer layer 608. In the operation depicted in FIG. 6A, superconductor precursor species 612 are directed to the substrate 600 to form the layer 610. In some embodiments, the superconductor precursor species 612 may be those materials that form a YBCO film. In different embodiments, the superconductor precursor species 612 may be provided by evaporation, sputtering, chemical vapor deposition, or other technique. In order to reduce problems found in conventional deposition techniques that are used to form thick YBCO superconductor layers, the substrate may be maintained at a temperature less than 300° C. during deposition of the layer 610. In conventional processing, thick superconductor layers, such as YBCO, may be deposited at elevated temperatures in excess of 750° C. This is useful to form a highly crystalline and c-axis textured layer. However, as thickness of the superconductor layer increases thermal stresses may build up within the superconductor layer to the extent that cracks develop within the superconductor layer. This is caused by the mismatch in thermal expansion coefficients between a substrate such as silicon and the superconductor layer. The thermal expansion mismatch causes a thermal stress to develop after layer deposition when the substrate is cooled. The differential thermal expansion coefficients frequently generate a tensile stress within the superconductor layer during cooling. When film thickness exceeds a certain value the tensile stress-thickness product generates a force sufficient to cause cracks to develop. For this reason, in conventional processing layer thickness of high quality YBCO films tends to be limited to below two micrometers.

However, in the embodiment of FIG. 6A, the layer 610 is deposited at a substantially lower temperature than in conventional processing. This may reduce thermal stress for forming the layer 610 due to the lower temperature range through which the substrate 600 cools after layer deposition. Accordingly, the layer 610 may be grown to thicknesses of 5 micrometers or more without cracking.

Turning now to FIG. 6B, there is shown a stage of processing in which the layer 610 is subject to laser annealing. A laser beam 614 is directed to the substrate 600 to recrystallize the layer 610 to form a c-axis texture superconductor layer 618. As noted previously, the SOI substrate tends to isolate the heating induced by laser beam 614 to the silicon layer 606 and above, as shown by the heated zone 616. Accordingly, the bulk silicon base 602 may remain below 100° C. during laser annealing, and thus generate little thermal stress since the bulk silicon substrate base 602 undergoes at most a modest cooling of less than one hundred degrees C. after laser processing. Moreover, because the silicon layer 606 is relatively thin any stress generated by thermal expansion mismatch between the silicon layer 606 and c-axis texture superconductor layer 618 may be more equally apportioned between the silicon layer 606 and c-axis texture superconductor layer 618, rendering cracking in the c-axis texture superconductor layer 618 less likely. In this manner, the present embodiments provide a technique to fabricate a thicker superconductor layer with superior current carrying capability.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An integrated superconductor device, comprising:
a substrate base;
a buffer layer disposed on the substrate base and comprising a preferred crystallographic orientation; and
a superconductor layer disposed on the buffer layer, the superconductor layer comprising a superconducting region, and a first region outside the superconducting region, wherein the first region and superconducting region have at least three elements in common, wherein the superconducting region comprises a superconductor material having a preferred crystallographic orientation in which the c-axis of crystallites are arranged perpendicularly to the plane of the substrate in preference over other possible orientations, and
wherein the first region comprises an amorphous material, a poorly crystalline material, randomly oriented crystallites, or an a-axis orientation.

2. The integrated superconductor device of claim 1, wherein the superconducting region comprises a copper oxide-based superconductor material having a c-axis texture in which the crystallites of the superconducting region have their c-axes oriented perpendicularly to a plane of the substrate.

3. The integrated superconductor device of claim 1, wherein the superconducting region has a critical current greater than 2 MA/cm$^2$.

4. An integrated superconductor device, comprising:
a substrate comprising a substrate base, the substrate defining a plane of the substrate;
a buffer layer disposed on the substrate base; and
a superconductor layer disposed on the buffer layer, the superconductor layer comprising a superconducting region, and a first region, disposed outside the superconducting region,
wherein the superconducting region comprises superconductor material having a preferred crystallographic orientation in which the c-axis of crystallites are arranged perpendicularly to the plane of the substrate in preference over other possible orientations, and
wherein the first region does not comprise a superconductor material having the preferred crystallographic orientation in which the c-axis of crystallites are arranged perpendicularly to the plane of the substrate in preference over other possible orientations.

5. The integrated superconductor device of claim 4, wherein the superconducting region has higher critical current than the first region.

6. The integrated superconductor device of claim 4, wherein the superconducting region and the first region have at least three elements in common.

7. The integrated superconductor device of claim 4, wherein the superconducting region and the first region have different crystalline orientations.

8. The integrated superconductor device of claim 4, wherein the superconducting region comprises a serpentine shape, a spiral shape, or a plurality of lines.

9. The integrated superconductor device of claim 4, wherein the first region comprises amorphous material or randomly oriented polycrystalline superconductor crystallites.

10. The integrated superconductor device of claim 4, wherein the superconductor layer comprises $ReBa_2Cu_3O_{7-x}$ where Re is a rare earth element, wherein the first region comprises a set of regions in which crystallites of the superconductor layer have their c-axes oriented parallel to the plane of the substrate.

11. The integrated superconductor device of claim 4, wherein the substrate comprises a set of raised features having sidewalls, and wherein the superconductor layer comprises superconductor material disposed on the sidewalls.

12. The integrated superconductor device of claim 4, wherein the buffer layer comprising a preferred crystallographic orientation that is operative to generate, in the superconductor layer, superconductor material having the preferred crystallographic orientation in which the c-axis of crystallites are arranged perpendicularly to the plane of the substrate in preference over other possible orientations.

13. The integrated superconductor device of claim 4, wherein the substrate base comprises a silicon-on-insulator (SOI) substrate, wherein a silicon layer of the SOI substrate comprises a thickness less than 10 micrometers.

14. An integrated superconductor substrate, comprising:
a substrate defining a plane of the substrate, the substrate further comprising a substrate base, wherein the substrate base comprises a set of raised features having sidewalls;
a buffer layer disposed on the substrate base; and
a superconductor layer disposed on the buffer layer, the superconductor layer comprising:
a superconducting region including superconductor material disposed on the sidewalls; and
a first region, disposed outside the superconducting region,
wherein the superconducting region comprises superconductor material having a c-axis orientation in which the c-axes of the crystallites are aligned perpendicularly to the plane of the substrate, and
wherein the first region does not comprise a superconductor material having the c-axis orientation.

15. The integrated superconductor substrate of claim 14, further comprising:
a metal disposed on a portion of the superconductor layer, including the superconductor material disposed on the sidewalls.

16. The integrated superconductor substrate of claim 14, wherein the superconductor layer comprises a material in a family of $ReBa_2Cu_3O_{7-x}$ material, wherein Re is a rare earth element, and wherein the first region comprises a set of regions in which crystallites of the layer have their c-axes oriented parallel to the plane of the substrate.

17. The integrated superconductor substrate of claim 14, the first region comprising a poorly crystalline or amorphous region having a thickness greater than two micrometers.

18. The integrated superconductor device of claim 14, wherein the buffer layer comprising a preferred crystallographic orientation that is operative to generate, in the superconductor layer, superconductor material having the c-axis orientation in which the c-axes of the crystallites are aligned perpendicularly to the plane of the substrate.

* * * * *